(12) United States Patent
Chi-Ming

(10) Patent No.: US 6,337,663 B1
(45) Date of Patent: Jan. 8, 2002

(54) BUILT-IN DUAL FREQUENCY ANTENNA

(75) Inventor: Chiang Chi-Ming, Pateh (TW)

(73) Assignee: Auden Techno Corp. (TW)

( * ) Notice: Subject to any disclaimer, the term of this patent is extended or adjusted under 35 U.S.C. 154(b) by 0 days.

(21) Appl. No.: 09/750,680

(22) Filed: Jan. 2, 2001

(51) Int. Cl.[7] .................................................. H01Q 1/38
(52) U.S. Cl. ................................ 343/702; 343/700 MS
(58) Field of Search ........................ 343/702, 700 MS, 343/895; 455/90

(56) References Cited

U.S. PATENT DOCUMENTS 6,124,831 A * 9/2000 Rutkowski et al. .. 343/700 MS
6,140,973 A * 10/2000 Annamaa et al. ........... 343/790

* cited by examiner

Primary Examiner—Don Wong
Assistant Examiner—James Clinger
(74) Attorney, Agent, or Firm—Troxell Law Office PLLC

(57) ABSTRACT

An upright style built-in dual frequency antenna comprising an electric circuit board of a microstrip antenna, wherein, a microstrip of a small width in the form of continuous waves connected on the two ends thereof to two horizontal microstrips of larger widths together forming the microstrip antenna is printed on one side of the electric circuit board, the electric circuit board of microstrip antenna is installed upright in the top portion of communication equipment, an elastic metallic connecting member is connected with an antenna circuit of a main board of a communication device and with one of the horizontal microstrips of a larger width; a printing surface of the electric circuit board of the microstrip antenna faces to the top of the communication device without impediment of any metallic member. Thereby, it can get an ideal signal emitting and receiving performance with such a hidden structure.

4 Claims, 4 Drawing Sheets

BUILT-IN DUAL FREQUENCY ANTENNA

BACKGROUND OF THE INVENTION

1. Field of the Invention

The present invention is related to an upright style built-in dual frequency antenna, and especially to an antenna which is built-in upright in a communication device such as a mobile phone, it can get an ideal signal emitting and receiving performance with its hidden structure.

2. Description of the Prior Art

It is the primary antenna type having a helical coil made from winding of a metal wire, diameter and material of the coil as well as the total length of such a helix antenna can influence the set functions thereof. However, such a helix antenna still is widely adopted and has a quite stable signal emitting and receiving structure. In meeting the requirement of modern communication equipment, such a helix antenna can get various resonance frequencies through different structural designs. For example, Japanese patent No. 1997-320748 has a helical coil provided in an external sleeve, and an adjusting member is extended in the external sleeve, length of the adjusting member determines its resonance frequency. British patent No. 2,206,243 has a linear conductor extended into a helical coil to form a dual frequency antenna. These helical coils are disadvantageous in being exposed and is mounted on the external surface of a communication device (such as a mobile phone).

Thereby, there are various miniaturized and planar microstrip antennas being developed gradually. However, earlier microstrip antennas, such as are disclosed in U.S. Pat. No. 3,921,177 and 3,810,183, generally are made from round or rectangular thin metallic rods, dielectric substance is filled in the space between such an antenna and the grounding member. Such a microstrip antenna generally can only allow narrower width of frequency. U.S. patent application Ser. No. 07/695,686 provides a polygonal helical microstrip antenna which is improved against the earlier microstrip antennas, the width of frequency thereof can approach that of a normal helix antenna with a constant impedance. But this microstrip antenna is disadvantageous in having quite a large diameter when in low frequency, and does not suit modern portable communication equipment.

Whatever they are, the way that a microstrip antenna is placed in a communication device for signal emitting and receiving has been feasible. However, such a microstrip antenna is formed by printing a metallic microstrip onto an electric circuit board; in the installing mode now used, e.g., when it is installed in a mobile phone, it is laid down. That is, the mobile hone has its internal elements arrayed and positioned in an overlapping mode. Such a structure for assembling renders the microstrip antenna to be subjected to influence of neighboring electronic or metallic elements, thus its signal emitting and receiving function can hardly reach an ideal situation.

SUMMARY OF THE INVENTION

The object of the present invention thereby is to provide an upright style built-in dual frequency antenna which is formed by printing a continuous microstrip with a smaller width onto an electric circuit board; both ends of the continuous microstrip with a smaller width are provided with a microstrip with a larger width, in order that the microstrips can get a high or low frequency harmonic oscillation point by coupling and by means of its electrical gross length. One of the microstrips with larger widths on the electric circuit board has one end thereof pierced to form a hole; an elastic metallic connecting member can have one end thereof connected with the pierced end, while the other end thereof can be pressed onto a connecting point on the antenna circuit of the main frame. Thereby, the microstrip antenna can be installed upright in the communication device without impediment of any metallic member, and more ideal signal emitting and receiving capability can be obtained.

The present invention will be apparent in its novelty as well as features after reading the detailed description of the preferred embodiment thereof in reference to the accompanying drawings.

DETAILED DESCRIPTION OF THE PREFERRED EMBODIMENT

Figure 1:
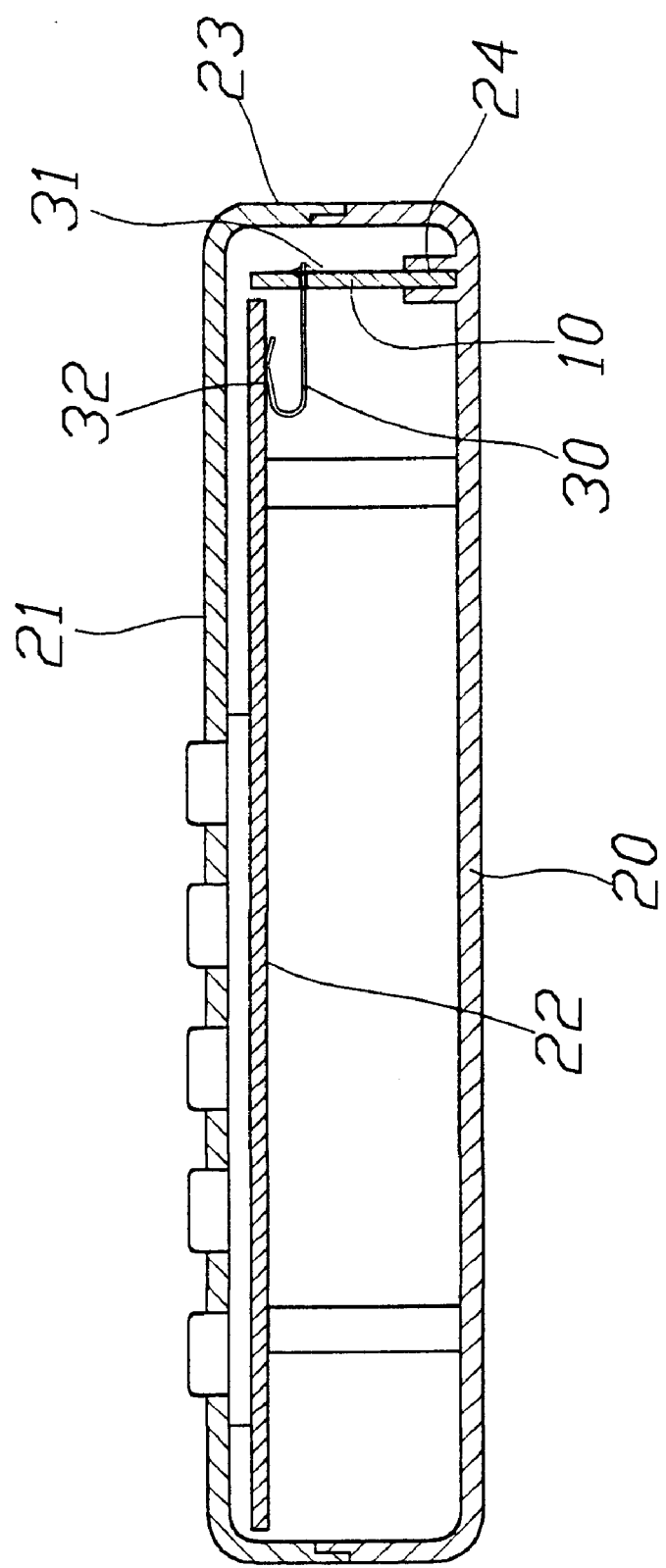
FIG. 1 is a sectional view showing a preferred embodiment of the present invention is installed in a mobile phone.

Referring firstly to FIG. 1, in this preferred embodiment wherein an electric circuit board 10 of a microstrip antenna of the present invention is installed in a mobile phone 20, the mobile phone 20 is provided with a panel surface 21 certainly including a screen area and a keying area, and with an internal main board 22. The electric circuit board 10 of the microstrip antenna of the present invention can be installed upright at a location slightly ahead of the main board 22 of the mobile phone 20 by means of a metallic connecting member 30 and gets closed to the top surface 23 of the mobile phone 20. The printing surface of the microstrip antenna faces to the top. The mobile phone 20 is provided at an appropriate location on the bottom of the housing thereof with an insertion groove 24 in favor of vertically disposing therein the electric circuit board 10.

Figure 2:
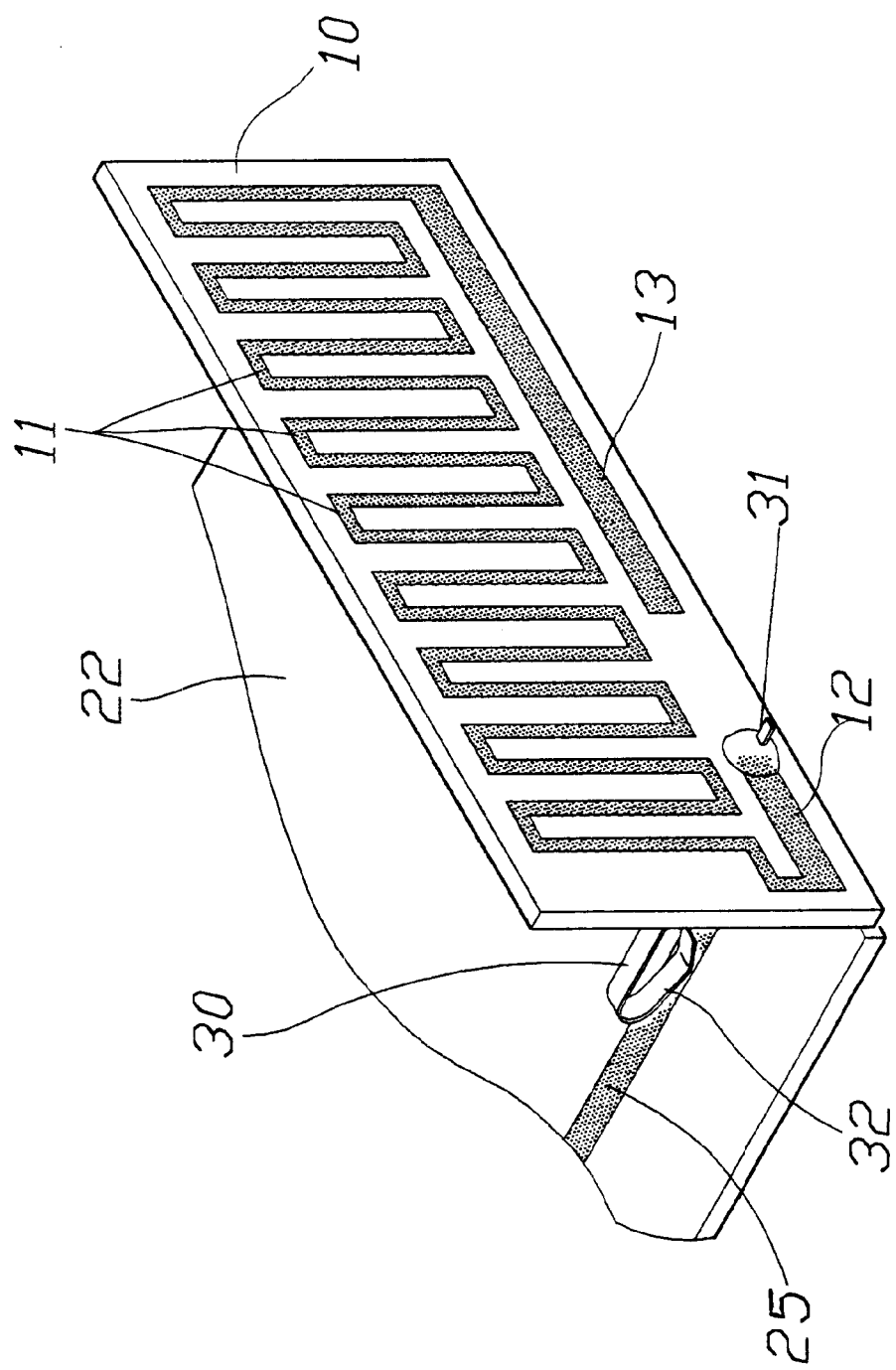
FIG. 2 is a perspective view showing the electric connection of the microstrip antenna with the electric circuit board in the main frame in FIG. 1.
Figure 3:
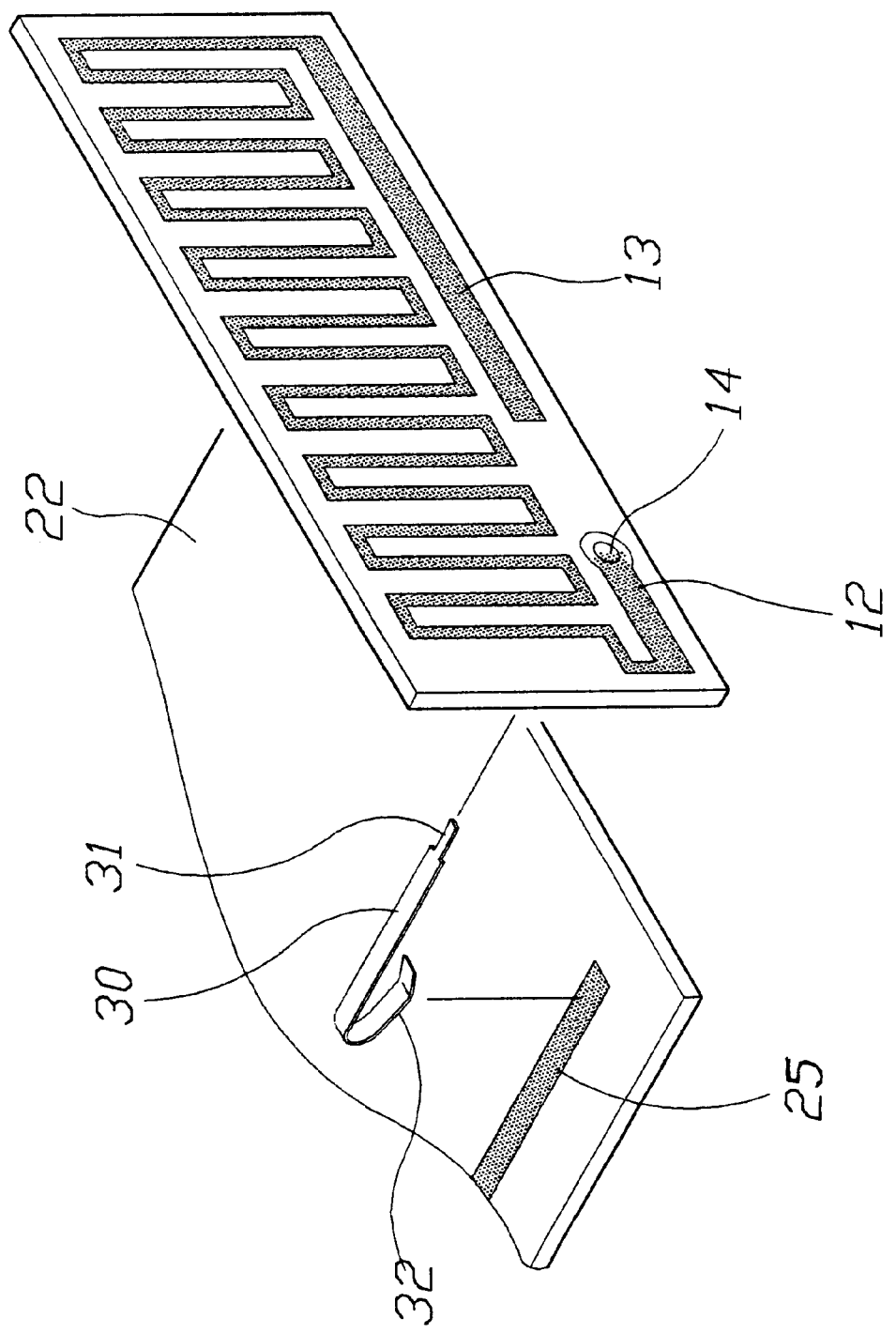
FIG. 3 is an analytic perspective view of FIG. 2.
Figure 4:
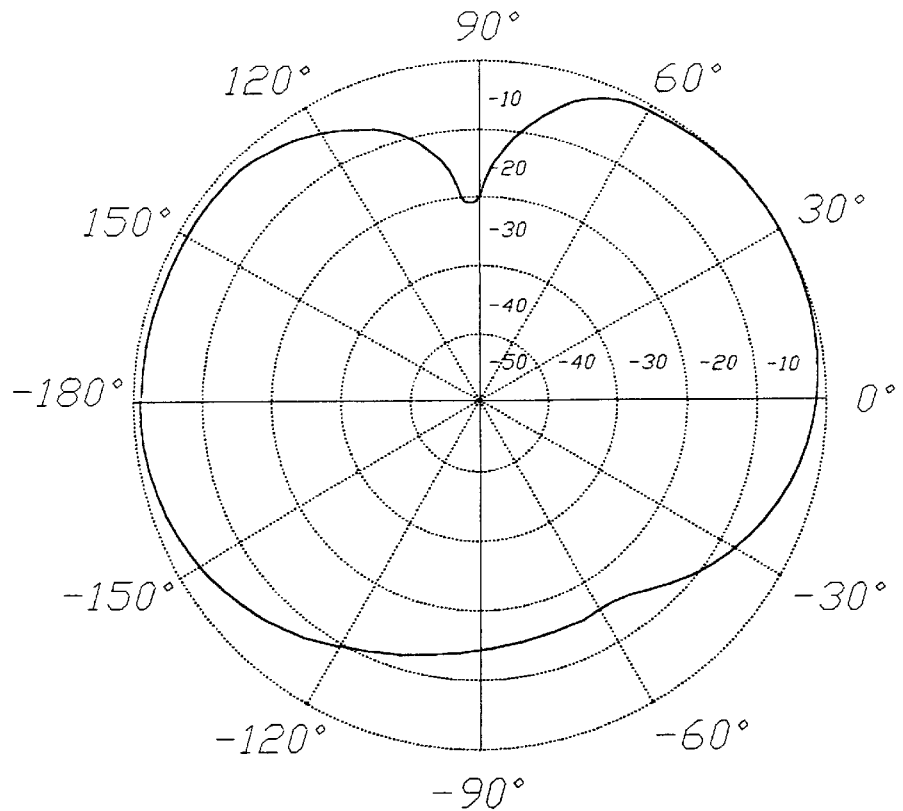
FIG. 4 is a drawing showing a radiation test diagram of the upright style microstrip antenna of the present invention in a longitudinal plane (i.e., the y-z plane)
Figure 5:
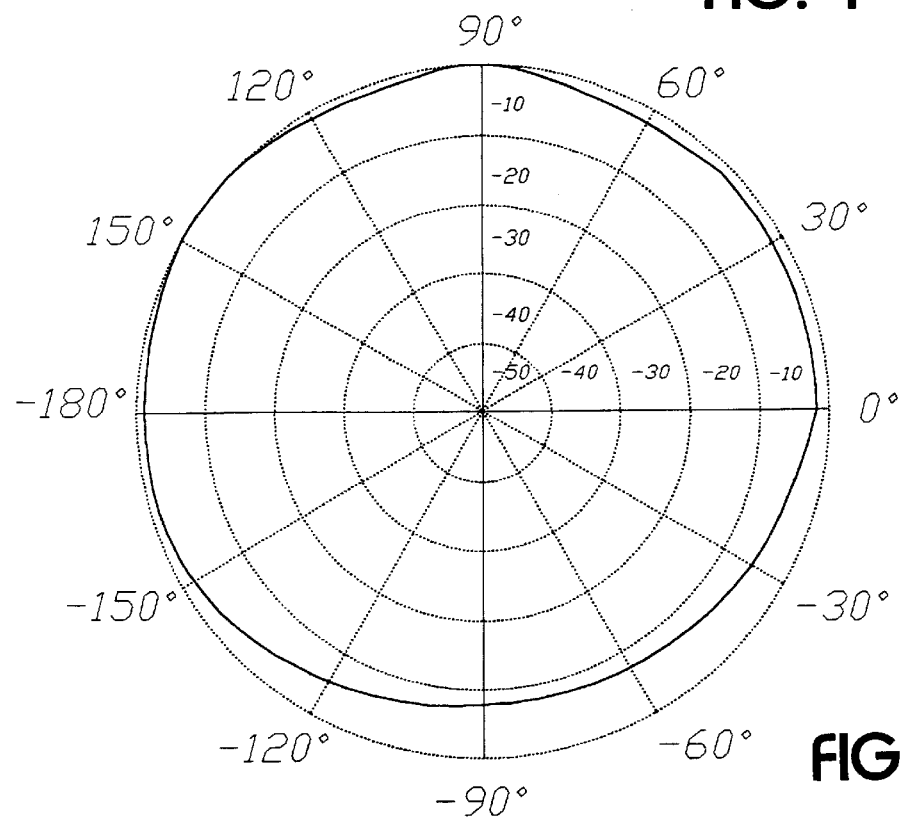
FIG. 5 is a drawing showing a radiation test diagram of the upright style microstrip antenna of the present invention in a latitudinal plane (i.e., the x-z plane).

As shown in FIG. 2 and 3, in the preferred embodiment shown, the electric circuit board 10 is provided with a microstrip 11 of a small width in the form of continuous waves by screen-printing. The microstrip 11 of the small width is connected on the two ends thereof to two horizontal microstrips 12, 13 of larger widths; the microstrip 12 is pierced to have a through hole 14. The microstrips 11, 12 and 13 can form different (high and low frequency) harmonic oscillation points by coupling and by means of their electrical gross length, thus can form a dual frequency microstrip antenna.

In the preferred embodiment shown, the metallic connecting member 30 has an inserting connection end 31, the other end thereof is bent to form a beveled elastic portion 32. The inserting connection end 31 can be connected to the through hole 14 of the microstrip 12 and is fixed by soldering etc. The electric circuit board 10 of the microstrip antenna with the metallic connecting member 30 thereby can be installed upright in the main frame of the mobile phone 20. The beveled elastic portion 32 abuts against a connecting end 25 on the antenna circuit of the main board 22.

By the fact that the above disclosed structure of the present invention is installed in and near the inner top of the mobile phone 20 as a structure in a nearly non-impediment state, the microstrip antenna printed on the electric circuit board 10 faces to the top of the mobile phone 20 without impediment of any metallic member (referring to FIG. 1), it can thus largely improve signal emitting and receiving performance of such kind of microstrip antenna in the mobile phone. Radiation tests in a longitudinal plane (i.e., the y-z plane) and in a latitudinal plane (i.e., the x-z plane) both show good performances.

The preferred embodiment cited above is only for illustrating the present invention. It will be apparent to those skilled in this art that various modifications or changes can be made without departing from the spirit and scope of this invention and also fall within the scope of the appended claims and are intended to form part of this invention.

What is claimed is:

1. A communication device having a dual frequency antenna and comprising:

a communication device housing bounding a cavity and having a panel surface including a keying area, the housing having an insertion groove extending into the cavity;

a main board located within the cavity and having a circuit thereon including a connecting end;

a planar electric circuit board mounted in the cavity in the insertion groove;

a flat microstrip antenna, for receiving and transmitting a high or low frequency harmonic oscillation points by coupling and by means of its electrical gross length, and comprising a metallic microstrip in the form of a continuous wave having a first and second opposite ends, and two linear metallic microstrips, one end of each of the two linear microstrips in contact with one of the opposite ends of the continuous wave microstrip, the continuous wave microstrip and the linear microstrips being disposed on a surface of the electric circuit board, the continuous wave microstrip having a first width, and the two linear metallic microstrips each having a second width, wherein said second width is greater than the first width; and, a metallic connecting member connecting one of the two linear metallic microstrips to the connecting end.

2. The dual frequency antenna as claimed in claim 1 wherein:

said microstrip antenna is disposed on the surface of the electric circuit by screen-printing.

3. The dual frequency antenna as claimed in claim 1 wherein:

one of the two linear metallic microstrips has first and second ends, said first end having an opening whereby the connecting member extends through the opening.

4. The dual frequency antenna as claimed in claim 1 wherein:

the metallic connecting member is elastic.

* * * * *